(12) United States Patent
Jeon et al.

(10) Patent No.: US 11,098,406 B2
(45) Date of Patent: Aug. 24, 2021

(54) SUBSTRATE SUPPORT UNIT AND DEPOSITION APPARATUS INCLUDING THE SAME

(71) Applicant: Samsung Electronics Co., Ltd., Suwon-si (KR)

(72) Inventors: Il Jun Jeon, Hwaseong-si (KR); Ji Ho Uh, Seoul (KR); Je Hak Lee, Hwaseong-si (KR); Jun Sung Lee, Suwon-si (KR); Ji Woon Im, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 381 days.

(21) Appl. No.: 16/043,255

(22) Filed: Jul. 24, 2018

(65) Prior Publication Data

US 2019/0203353 A1 Jul. 4, 2019

(30) Foreign Application Priority Data

Jan. 4, 2018 (KR) ........................ 10-2018-0001159

(51) Int. Cl.
*C23C 16/458* (2006.01)
*H01L 21/687* (2006.01)
*C23C 16/50* (2006.01)
*H01J 37/32* (2006.01)

(52) U.S. Cl.
CPC .......... *C23C 16/4585* (2013.01); *C23C 16/50* (2013.01); *H01J 37/32715* (2013.01); *H01L 21/68771* (2013.01); *H01L 21/68785* (2013.01)

(58) Field of Classification Search
CPC ................. C23C 16/4585; C23C 16/50; H01J 37/32715; H01L 21/68771; H01L 21/68785

See application file for complete search history.

(56) References Cited

U.S. PATENT DOCUMENTS

| | | |
|---|---|---|
| 9,428,833 B1 | 8/2016 | Duvall et al. |
| 9,698,042 B1 | 7/2017 | Baldasseroni et al. |
| 2014/0235063 A1 | 8/2014 | McMillin et al. |
| 2016/0126090 A1 | 5/2016 | Song et al. |
| 2016/0172165 A1* | 6/2016 | Jeon ................. H01J 37/32715 118/723 E |
| 2016/0211165 A1 | 7/2016 | McChesney et al. |
| 2016/0289827 A1* | 10/2016 | Augustyniak ........... C23C 16/52 |
| 2017/0275756 A1 | 9/2017 | Blaquiere et al. |
| 2017/0278681 A1 | 9/2017 | Qi et al. |

* cited by examiner

*Primary Examiner* — Kelly M Gambetta
(74) *Attorney, Agent, or Firm* — Sughrue Mion, PLLC

(57) ABSTRACT

A substrate support unit according to an example embodiment of the present inventive concept may include a support having an upper surface on which a substrate is disposed; a coupling ring on which an edge of the substrate is disposed, the coupling ring being having an annular shape, wherein the coupling ring is disposed on an edge of the support; and an arm part for raising and lowering the coupling ring and the substrate, wherein the arm part is disposed below the coupling ring and under a portion of the coupling ring, wherein the coupling ring has a first region disposed on the arm part and a second region disposed around the first region, wherein the first region has a thickness greater than that of the second region.

18 Claims, 10 Drawing Sheets

SUBSTRATE SUPPORT UNIT AND DEPOSITION APPARATUS INCLUDING THE SAME

CROSS-REFERENCE TO RELATED APPLICATION

This application claims benefit of priority to Korean Patent Application No. 10-2018-0001159 filed on Jan. 4, 2018 in the Korean Intellectual Property Office, the disclosure of which is hereby incorporated herein by reference in its-entirety.

FIELD

The present inventive-concept relates to a substrate support unit and a deposition apparatus including the same.

BACKGROUND

In order to manufacture a semiconductor device, a plurality of processes such as a deposition process, a lithography process; an etching process, a cleaning process, and the like are required, and a plurality of apparatuses are used. Particularly, semiconductor wafers are increasing in size, and accordingly, it is required to develop an apparatus capable of performing uniform processing at the time of processing a substrate.

SUMMARY

An aspect of the present inventive concept is to provide a substrate support unit and a deposition apparatus including the same, capable of improving reliability of a process.

According to an aspect of the present inventive concept, a substrate support unit may include a support having an upper surface; a coupling ring having an annular shape, wherein the coupling ring is disposed on an edge of the support; and an arm part for raising and lowering the coupling ring and a substrate disposed on the support, wherein an edge of the substrate is disposed on the coupling ring and wherein the arm part is disposed below and under a portion of the coupling ring, wherein the coupling ring comprises: a first region disposed on the arm part; and a second region disposed around the first region, and wherein the first region has a thickness greater than that of the second region.

According to an aspect of the present inventive concept, a substrate support unit may include a support having an upper surface; a coupling ring having an annular shape, wherein the coupling ring is disposed on an edge of the support, and wherein the coupling ring has an asymmetric cross-section with respect to a central axis thereof; and an arm part for raising and lowering the coupling ring and a substrate disposed on the support, wherein an edge of the substrate is disposed on the coupling ring and wherein the arm part is disposed below the coupling ring under a portion of the coupling ring.

According to an aspect of the present inventive concept, a deposition apparatus may include a chamber; a substrate support unit positioned in the chamber for supporting a substrate on which a deposition process is performed; and a gas injection unit disposed above the substrate support unit for injecting a process gas onto the substrate, wherein the substrate support unit comprises: a support having an upper surface; a coupling ring, wherein the coupling ring has an annular shape and is disposed on an edge of the support; and an atm part for raising and lowering the coupling ring and the substrate disposed on the support and on which a deposition process is performed, wherein an edge of the substrate is disposed on the coupling ring and wherein the arm part is disposed below the coupling ring at a portion of the coupling ring.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
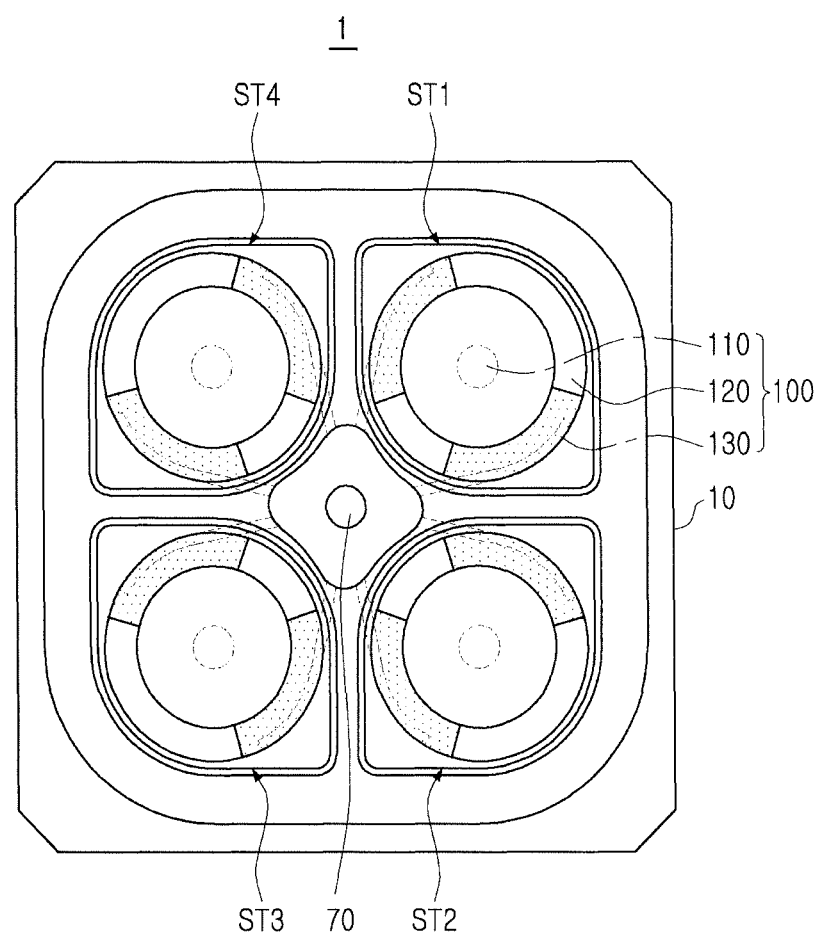
FIGS. 1 and 2 are a schematic plan view and a schematic cross-sectional view of a deposition apparatus according to example embodiments.
Figure 2:
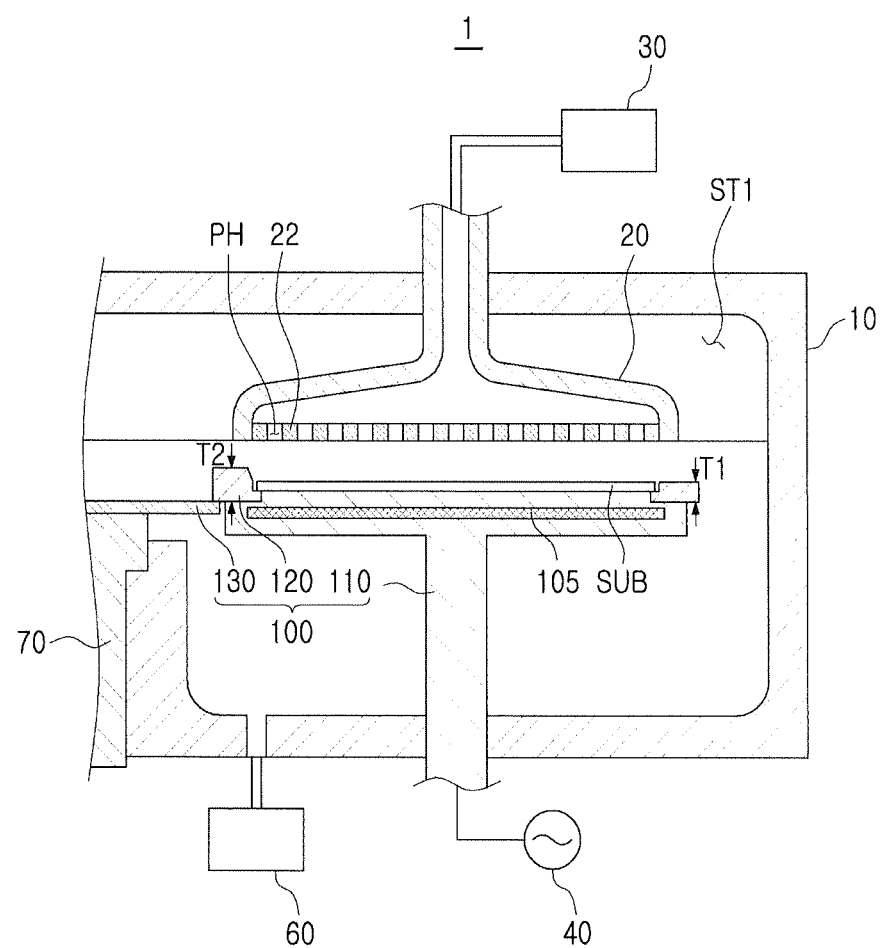

FIGS. 1 and 2 are a schematic plan view and a schematic cross-sectional view of a deposition apparatus according to example embodiments.

Referring to FIGS. 1 and 2, a deposition apparatus 1 may include a chamber 10, a substrate support unit 100 disposed in the chamber 10, a gas injection unit 20 disposed in the chamber 10, a gas supply unit 30 connected to the gas injection unit 20, a power supply unit 40 connected to the substrate support unit 100, and an exhaust unit 60 connected to an interior of the chamber 10. The deposition apparatus 1 may have four stations ST1, ST2, ST3 and ST4 where a deposition process is carried out in the chamber 10, and may further include a rotation driving unit 70 disposed at the center of the four stations ST1, ST2, ST3 and ST4. Each of the stations ST1, ST2, ST3 and ST4 may include the gas injection unit 20, the substrate support unit 100, the gas supply unit 30, the power supply unit 40 and the exhaust unit 60, but the present inventive concept is not limited thereto. The stations ST1, ST2, ST3 and ST4 may also share some of the units.

The deposition apparatus 1 may be an apparatus for forming a thin film on a substrate SUB, and may be a chemical vapor deposition (CVD) apparatus or an atomic layer deposition (ALD) apparatus, for example.

The substrate SUB to be processed by the deposition apparatus 1 may be provided on the substrate support unit 100. The substrate SUB may be, for example, a silicon wafer used for manufacturing a semiconductor integrated circuit (IC).

The chamber 10 may provide a space where a deposition process is performed. The chamber 10 may be formed of a top wall, a side wall, and a bottom wall and may be configured to surround the stations ST1, ST2, ST3, and ST4 all together. Although not shown, a passage through which the substrate SUB is carried in and out may be provided on one side of the chamber 10.

The substrate support unit 100 may be disposed in a lower region within the chamber 10. The substrate support unit 100 may include a support 110 having an upper surface on which the substrate SUB is disposed, a coupling ring 120 on which an edge of the substrate SUB is disposed, the coupling ring 120 being provided in an annular shape on an edge of the support 110, and an arm part 130 disposed below the coupling ring 120 under a portion of the coupling ring 120 and raising and lowering the coupling ring 120, thereby raising and lowering the substrate SUB.

The support 110 may include an electrode 105 therein, and the electrode 105 may be supplied with RF power from the power supply unit 40. The coupling ring 120 may have an asymmetric cross-section in a vertical direction through a central axis of the support 110. For example, the coupling ring 120 may have regions having different thicknesses T1 and T2, as shown in FIG. 2. A structure of the substrate support unit 100 including the coupling ring 120 will be described in more detail with reference to FIGS. 3 and 4.

The gas injection unit 20 may be disposed above the substrate support unit 100 so as to face the substrate support unit 100 in the chamber 10. The gas injection unit 20 may be connected to the gas supply unit 30 and may distribute and provide process gases supplied from the gas supply unit 30 to an upper surface of the substrate SUB. The gas injection unit 20 may be, for example, a showerhead and may include a plate 22 having a plurality of injection holes PH for injecting process gases. The injection holes PH may be arranged radially with respect to a central region of the gas injection unit 20. In example embodiments, a diffusion plate for dispersing process gases may be further disposed within the gas supply unit 30.

The gas supply unit 30 may include a gas supply source, a mass flow controller (MFC) for regulating a supply flow rate, and a valve for supplying a gas to or blocking a gas from the chamber 10.

The power supply unit 40 may supply RF power and generate an electric field due to a difference in voltage levels between upper and lower portions of the substrate SUB, thereby generating plasma in a process region in which a deposition process is performed on the substrate SUB. Although not shown, by the power supply unit 40, the gas injection unit 20 may be connected to a ground voltage. The process region may correspond to an area between the substrate support unit 100 and the gas injection unit 20. In embodiments, at least a portion of process gases is plasmarized; so that the process gases may be activated to promote reactions on the substrate SUB. Therefore, the distribution of the electric fields around the substrate SUB in the process region needs to be uniform, so that the deposition process may be performed uniformly over the entire substrate SUB.

The exhaust unit 60 may discharge reaction by-products and residual gases in the chamber 10 to the outside. The exhaust unit 60 may include a vacuum pump, and the materials in the chamber 10 may be discharged externally by vacuum suction force generated by the vacuum pump. In example embodiments, the arrangement position, the number, and the like, of the exhaust unit 60, may be variously changed.

The rotation driving unit 70 may be located among the stations ST1, ST2, ST3, ST4 at the center of the chamber 10. The rotation driving unit 70 may drive the arm part 130 to raise and lower the coupling ring 120 and the substrate SUB and may rotate the arm part 130 to move the substrate SUB among the stations ST1, ST2, ST3, and ST4.

Configurations, structures and arrangements of the chamber 10, the gas injection unit 20, the substrate support unit 100, the gas supply unit 30, the power supply unit 40, and the exhaust unit 60 of the deposition apparatus 1 shown in FIGS. 1 and 2 are illustrative, and may be variously changed in the embodiments.

Figure 3:
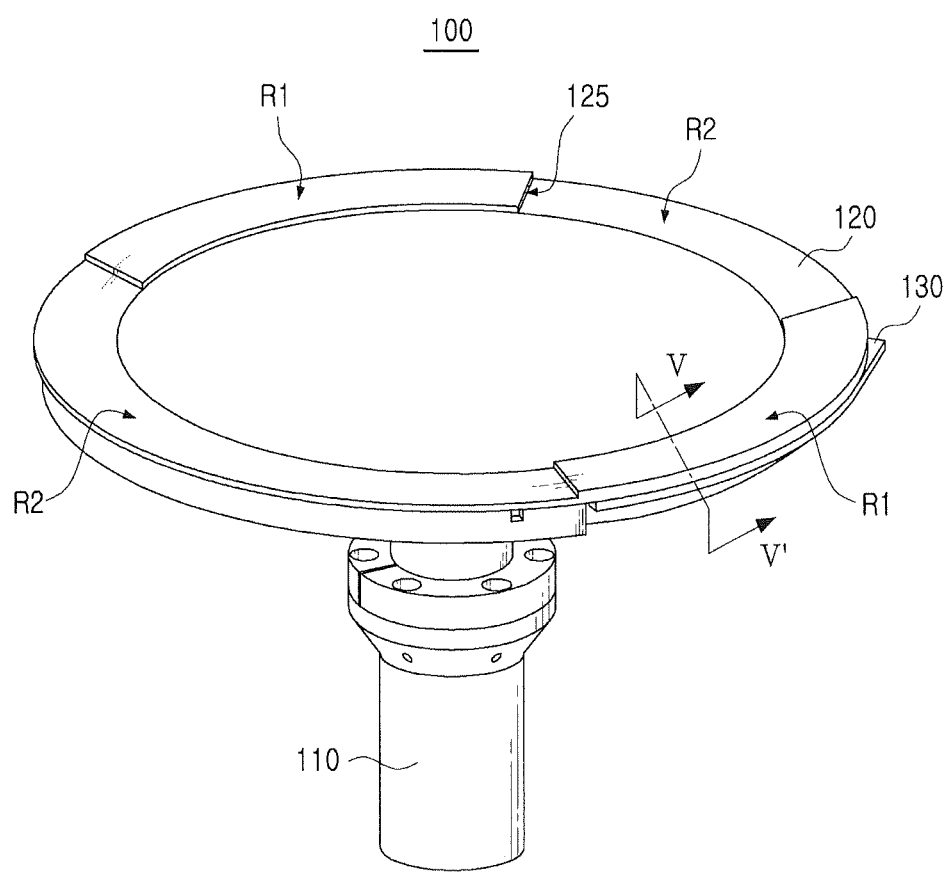
FIGS. 3 and 4 are a schematic perspective view and a schematic plan view of a substrate support unit according to example embodiments.
Figure 4:
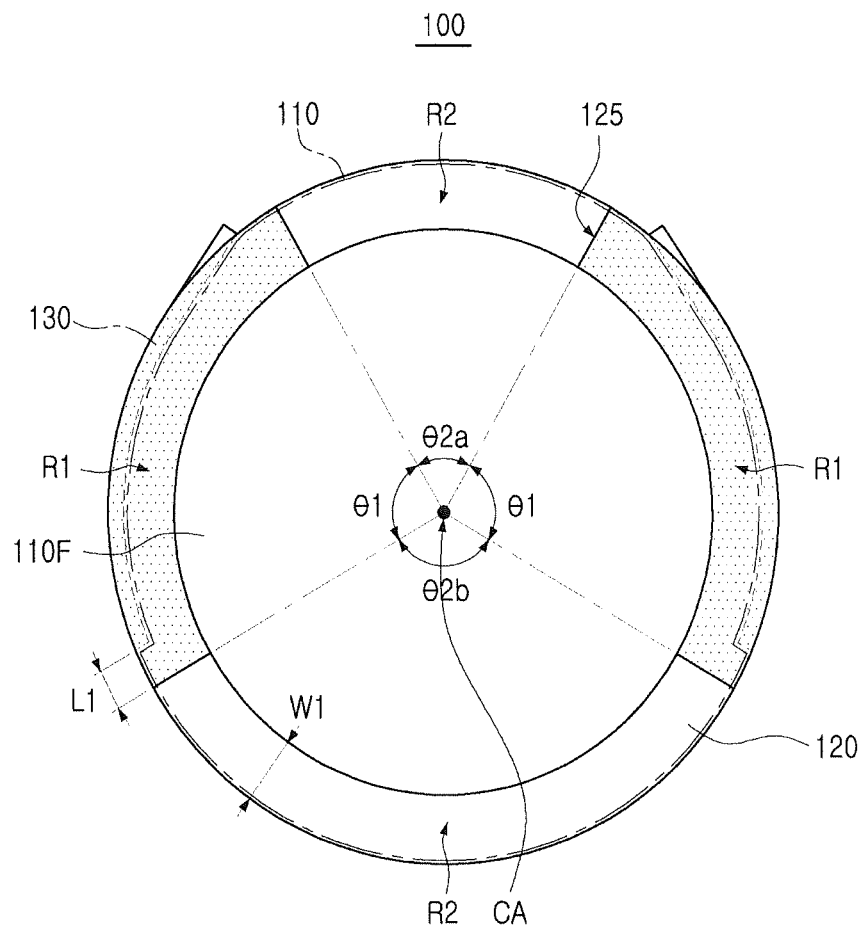

FIGS. 3 and 4 are a schematic perspective view and a schematic plan view of a substrate support unit according to example embodiments.

Figure 5:
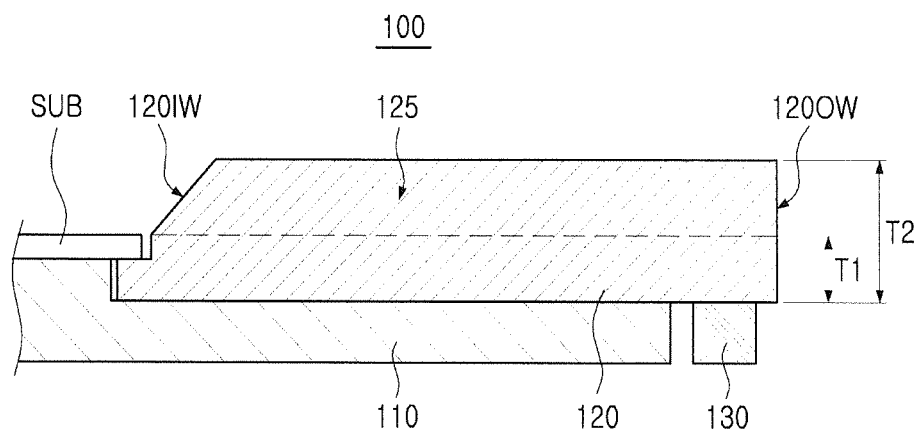
FIG. 5 is a schematic partial cross-sectional view of a substrate support unit according to example embodiments.

FIG. 5 is a schematic partial cross-sectional view of a substrate support unit according to example embodiments. FIG. 5 shows a cross-section taken along line V-V' of FIG. 3.

Referring to FIGS. 3 to 5, the substrate support unit 100 may include the support 110, the coupling ring 120, and the arm part 130. The substrate support unit 100 may be installed in various semiconductor manufacturing apparatuses such as an etching apparatus as well as the deposition apparatus described above with reference to FIGS. 1 and 2. In particular, the substrate support unit 100 may be installed in a semiconductor manufacturing apparatus using plasma.

The support 110 includes a column portion having a columnar shape and disposed at a central axis thereof, and may have a circular upper surface 110F on which the substrate SUB is disposed. According to embodiments, the column portion may include a lifting pin at an upper end thereof, whereby the substrate SUB may be raised and lowered to be carried in and out of the chamber 10 of FIG. 2. Also, according to embodiments, the support 110 may include a thermal conductor such as a thermal wire, therein, whereby a process temperature may be controlled.

The support 110 may be installed inwardly of the arm part 130 in a region thereof where the arm part 130 is disposed, as shown in FIGS. 4 and 5. Accordingly, the support 110 may have a reduced diameter at the side of the arm part 130, and may have a bent portion bent inwardly at a region thereof facing one end of the arm part 130. As such, the support 110 may have an asymmetric shape with respect to a central axis thereof in a plan view. In addition, the support 110 may be structured such that the upper surface 110F thereof on which the substrate SUB is disposed protrudes upwardly, whereby the upper surface 110F on which the substrate SUB is disposed may be stepped with respect to a region in which the coupling ring 120 is disposed. The support 110 may include, but is not limited to, aluminum nitride (AlN), for example.

The coupling ring 120 may be disposed at the edge of the support 110 so that the edge of the substrate SUB is disposed thereon. The coupling ring 120 may be located in a stepped region of the support 110 around the protruding upper surface 110F of the support 110, and may have an annular shape in a plan view. The coupling ring 120 may be formed of a dielectric material to uniformly transmit electric fields. The coupling ring 120 may include at least one of, for example, aluminum oxide ($Al_2O_3$), aluminum nitride (AlN), silicon carbide (SiC), and yttrium oxide ($Y_2O_3$).

The coupling ring 120 may have first and second regions R1 and R2, and the first and second regions R1 and R2 may include regions having different thicknesses. The first and second regions R1 and R2 may be divided and arranged in an annular shape. For example, as shown in FIG. 4, the first and second regions R1 and R2 may be regions divided at specific angles with respect to or central axis CA of the coupling ring 120. The first region R1 may include an area including regions disposed on the arm part 130 and the second region R2 may be an area other than the first region R1.

The first and second regions R1 and R2 may have different thicknesses and here, the thicknesses may mean maximum thicknesses. The first region R1 may have a second thickness T2 greater than a first thickness T1 of the second region R2 in the outside of the region in which the substrate SUB is disposed. That is, the first and second regions R1 and R2 may have the same thickness in the region supporting the substrate SUB, but may have different thicknesses in the outside of the region in which the substrate SUB is disposed. The electric fields induced by the electrode 105 described above with reference to FIG. 2 may be formed strongly on the arm part 130 due to the asymmetric shape of the support 110. Also in this case, as the first region R1 on the arm part 130 is relatively thickly installed, the coupling ring 120 may locally cancel the electric fields so that the electric fields can be uniformly distributed over the entire substrate SUB. Accordingly, a thickness of a thin film deposited on the substrate SUB may be uniform. This will be described in more detail with reference to FIGS. 12A to 13 below.

The second thickness T2 may range from 1.2 times to 1.8 times the first thickness T1, but is not limited thereto. When the second thickness T2 is larger than the above range, a flow of the process gases around the substrate SUB may be affected. When the second thickness T2 is smaller than the above range, effects of reducing the strength of the electric fields may not be significant. The relative thicknesses of the first and second regions R1 and R2 may be selected depending on a size of the coupling ring 120, a material forming the coupling ring 120, the arrangement of the arm part 130 and a position in which the substrate SUB is disposed.

According to the structures of the first and second regions R1 and R2, an upper surface of the first region R1 may protrude to a greater height than that of the second region R2. In the first region R1, a protrusion 125 may be provided such that the upper surface thereof protrudes above the upper surface of the second region R2. Lower surfaces of the first and second regions R1 and R2 may form a single flat surface. In this embodiment, the coupling ring 120 may have two first regions R1, i.e., two protrusions 125. The protrusions 125 may be positioned asymmetrically with respect to the central axis CA of the coupling ring 120, as shown in FIG. 4. The protrusions 125 may be disposed adjacent to each other in a direction in which the rotation driving unit 70 of FIG. 1 is installed. Thus, angles θ1 formed by both ends of the protrusions 125 may be equal to each other, and angles θ2a and θ2b formed by the both ends of the second regions R2 between the first regions R1 may be different from each other. The angle θ2a formed by the both ends of the second region R2 disposed adjacent to the rotation driving unit 70 may be an acute angle, for example, and may be smaller than the angle θ2b formed by the both ends of the other second region R2. In example embodiments, the numbers of the first and second regions R1, R2 may be varied variously.

The protrusions 125 are provided over an entire width W1 of the coupling ring 120 in the outside of the region in which the substrate SUB is disposed, and may have an annular band shape. As shown in FIG. 4, the protrusions 125 may extend from ends of the arm part 130 disposed therebelow along an outer circumferential surface thereof by a predetermined length L1, but the present inventive concept is not limited thereto. In example embodiments, ends of the protrusions 125 may lie in parallel with the ends of the arm part 130 on a vertical line, or may be inwardly reduced on the arm part 130.

As shown in FIG. 5, an inner surface 120IW of the coupling ring 120 may form an inclined surface in the region in which the protrusion 125 is formed. The inclined surface may be formed to have a reduced thickness toward a region of the support 110 where the substrate SUB is disposed. The inclined surface may facilitate the mounting of the substrate SUB and minimize influences on the flow of the process gases on the substrate SUB. In example embodiments, an angle and a position of the inclined surface may be variously changed. For example, the inclined surface may start at the same level as an upper surface of the support 110 or a lower surface of the substrate SUB. An outer surface 120OW of the coupling ring 120 may protrude outwardly from the arm part 130 disposed therebelow, but is not limited thereto. In example embodiments, the outer surface 120OW of the coupling ring 120 may be connected to an outer surface of the arm part 130 to form a single surface.

Figure 6:
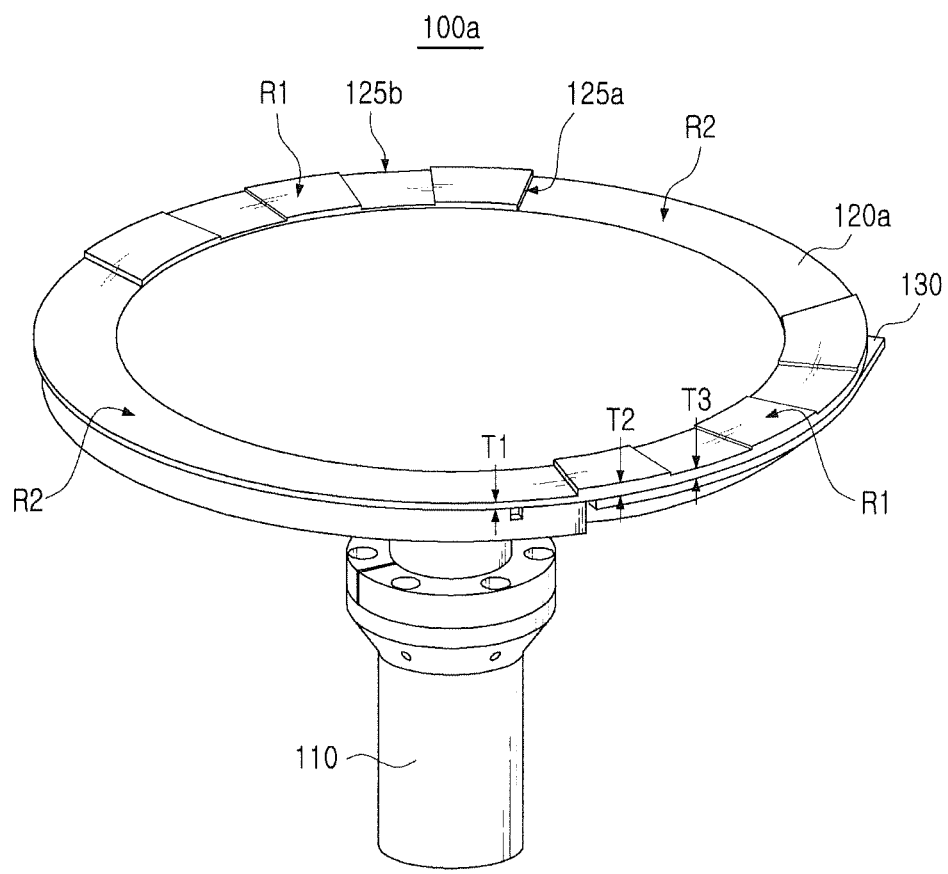
FIG. 6 is a schematic perspective view of a substrate support unit according to example embodiments.

FIG. 6 is a schematic perspective view of a substrate support unit according to example embodiments.

Referring to FIG. 6, a substrate support unit 100a may include a coupling ring 120a having first and second protrusions 125a and 125b which are located in a first region R1 and have different thicknesses, unlike the embodiment of FIG. 3. Accordingly, the coupling ring 120a may have a second thickness T2 greater than a first thickness T1 of the second region R2 in the region in which the first protrusion 125a is disposed, and may have a third thickness T3 smaller than the second thickness T2 in the region in which the second protrusion 125b is formed.

The second thickness T2 may be 1.2 times to 1.8 times the first thickness T1 and the third thickness T3 may be a thickness between the first thickness T1 and the second thickness T2, but is not limited thereto. In example embodiments, the third thickness T3 may be equal to the first thickness T1. An arrangement order, the numbers, relative sizes, and the like of the first and second protrusions 125a and 125b may be adjusted in consideration of the distribution of electric fields on the substrate support unit 100a.

FIGS. 7 to 10 are schematic partial cross-sectional views of a substrate support unit according to example embodiments. FIGS. 7 to 10 show regions corresponding to that of FIG. 5.

Figure 7:
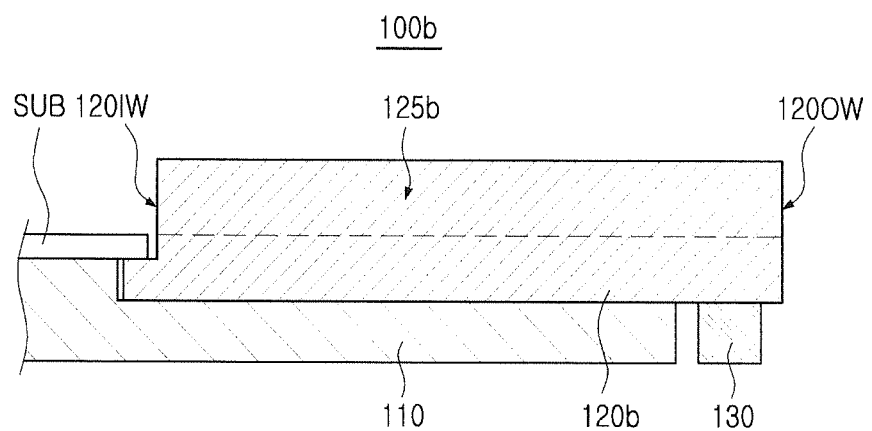
FIGS. 7 to 10 are schematic partial cross-sectional views of a substrate support unit according to example embodiments.

Referring to FIG. 7, a substrate support unit 100b may include a coupling ring 120b having an inner surface 120IW forming a vertical surface in the region in which the protrusion 125b is formed, unlike the embodiment of FIG. 5. In this case, the volume of the protrusion 125b in a region adjacent to the substrate SUB may be further increased, and effects of reducing electric fields may be further increased. In addition, the protrusion 125b may serve to prevent sliding of the substrate SUB by the vertical inner surface 120IW.

Figure 8:
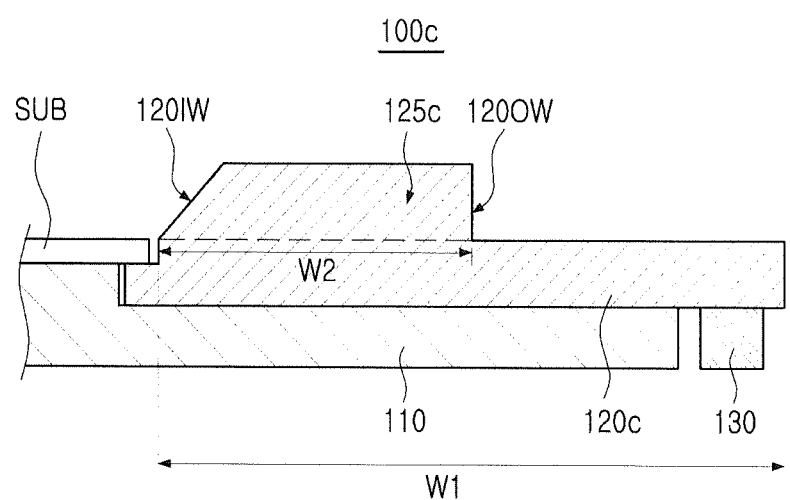

Referring to FIG. 8, unlike the embodiment of FIG. 5, a substrate support unit 100c may include a coupling ring 120c installed such that a protrusion 125c has a width W2 smaller than an entire width W1 in the outside of the region in which the substrate SUB is disposed. The width W2 may be variously changed in the embodiments. The protrusion 125c may be biased to the region adjacent to the substrate SUB, i.e., may be positioned inwardly of the coupling ring 120c. The outer surface 120OW of the coupling ring 120c in the region in which the protrusion 125*c* is formed may be positioned on the support 110.

Figure 9:
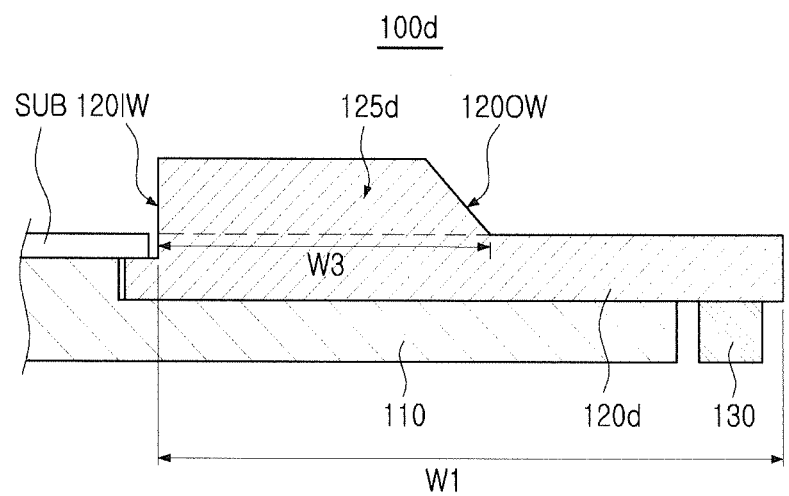

Referring to FIG. 9, unlike the embodiment of FIG. 5, a substrate support unit 100*d* may include a coupling ring 120*d* installed such that a protrusion 125*d* has a width W3 smaller than an entire width W1 in the outside of the region in which the substrate SUB is disposed. The width W3 may be variously changed in the embodiments. The protrusion 125*d* may be biased toward the region adjacent to the substrate SUB, i.e., may be positioned inwardly of the coupling ring 120*d*. However, unlike the embodiment of FIG. 8, the inner surface 120IW of the coupling ring 120*d* forms a vertical surface and the outer surface 120OW thereof forms an inclined surface in the region in which the protrusion 125*d* is formed. The inclined surface may be formed such that a thickness of the coupling ring 120*d* decreases in a direction toward the outside of the substrate SUB.

Figure 10:
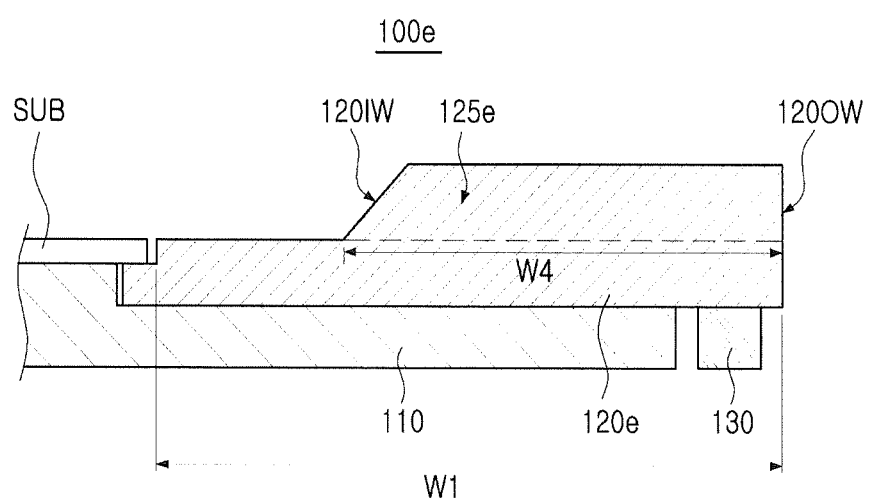

Referring to FIG. 10, unlike the embodiment of FIG. 5, a substrate support unit 100*e* may include a coupling ring 120*e* installed such that a protrusion 125*e* has a width W4 smaller than an entire width W1 in the outside of the region in which the substrate SUB is disposed. The protrusions 125*e* may be biased to a region not adjacent to the substrate SUB, i.e., may be positioned outwardly of the coupling ring 120*e*, unlike in the embodiments of FIGS. 8 and 9. The inner surface 120IW of the coupling ring 120*e* in the region in which the protrusion 125*e* is formed may form an inclined surface so that a thickness of the coupling ring 120*e* decreases in a direction toward the region in which the substrate SUB is disposed. The outer surface 120OW of the coupling ring 120*e* in the region in which the protrusion 125*e* is formed may be a vertical surface, but is not limited thereto.

Figure 11:
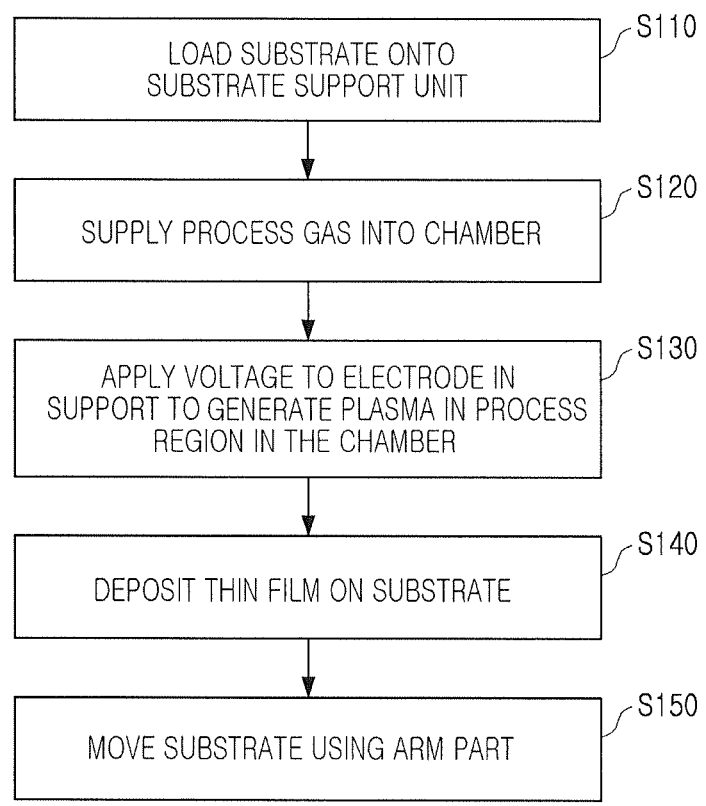
FIG. 11 is a flowchart for explaining a thin film forming method using a deposition apparatus according to example embodiments.

FIG. 11 is a flowchart for explaining a thin film forming method using a deposition apparatus according to example embodiments.

Referring to FIG. 11, a method of manufacturing a semiconductor device including a method of forming a thin film on a substrate SUB using the deposition apparatus 1 shown in FIGS. 1 and 2 will be described. Referring to FIGS. 1, 2, and 11, a method of forming a thin film may include loading the substrate SUB onto the substrate support unit 100 (S110), supplying a process gas for deposition into the chamber 10 (S120), applying a voltage to the electrode 105 in the support 110 to generate plasma in a process region in the chamber 10 (S130), depositing a thin film on the substrate SUB (S140), and moving the substrate SUB using the arm part 130 (S150).

The process S110 of loading the substrate SUB onto the substrate support unit 100 may be performed by positioning the substrate SUB on the upper surface of the support 110 using a lift pin in the arm part 130 or the support 110. The substrate SUB may be moved and loaded from other stations ST1, ST2, ST3, ST4 or from the outside. The substrate support unit 100 may be a substrate support unit 100, 100*a*, 100*b*, 100*c*, 100*d*, or 100*e* according to the embodiments described above with reference to FIGS. 3 through 10. Thus, the substrate support unit 100 may include the coupling ring 120 having an asymmetric shape about a central axis or the support 110. The substrate SUB may be disposed on the support 110 and the coupling ring 120.

The process (S120) of supplying the process gas for deposition into the chamber 10 may be a process of supplying a source gas and a reaction gas from the gas supply unit 30 into the chamber 10. The process gas may be supplied from the upper portion of the substrate SUB through the injection holes PH of the gas injection unit 20. However, the position of the gas injection unit 20 and the scheme of supplying the process gas may be changed according to the embodiments, and for example, the process gas may be supplied from one side of the substrate SUB.

The process (S130) of applying a voltage to the electrode 105 in the support 110 to generate plasma in a processing region in the chamber 10 may be a process of applying an electrical signal to the electrode 105 in the support 110 and the gas injection unit 20. Due to the process, an electric field is formed between the substrate support unit 100 and the gas injection unit 20, so that plasma may be generated in the process region.

The process (S140) of depositing a thin film on the substrate (SUB) may be a process of activating the process gas by the plasma to deposit the thin film. In particular, by using the substrate support unit 100 including the support 110 having an asymmetric shape and coupling ring 120 having an asymmetric shape corresponding thereto, an electric field may be uniformly formed in the process region, so that the deposition of the thin film on the substrate SUB may be performed uniformly.

The process (S150) of moving the substrate SUB using the arm part 130 is a process of raising and lowering the arm part 130 by the rotation driving unit 70 to move the arm part 130 to other stations ST1, ST2, ST3, and ST4. The moved substrate SUB may be carried out of the chamber 10 by a robot arm or the like in a state of being raised by a lift pin in the support 110. Thereafter, depending on a manufacturing process of the semiconductor device, it may be moved to another semiconductor manufacturing apparatus to perform another process.

Figure 12A:
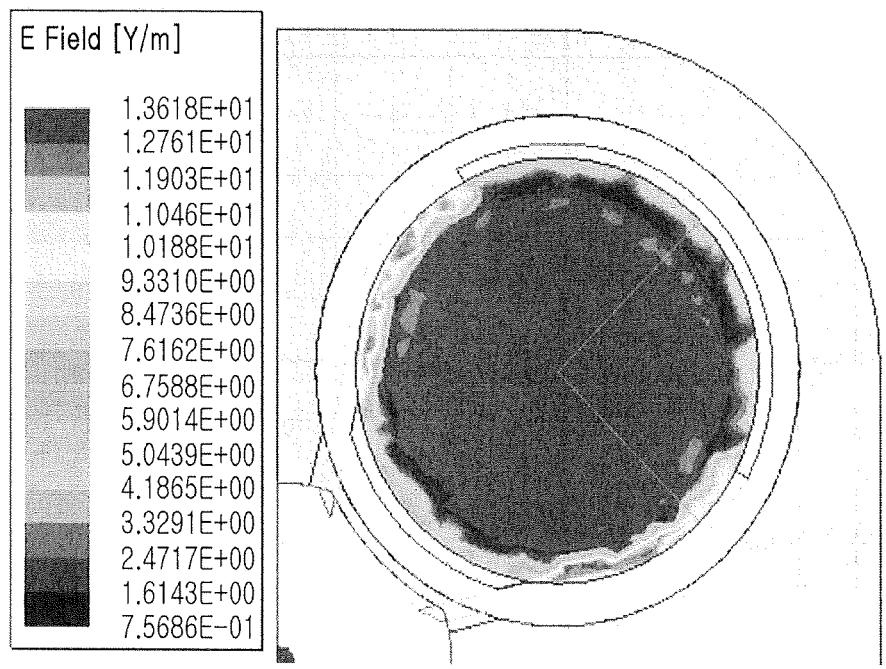
FIGS. 12A and 12B are diagrams illustrating simulation results on distribution of electric fields in the deposition apparatus according to the example embodiments.
Figure 12B:
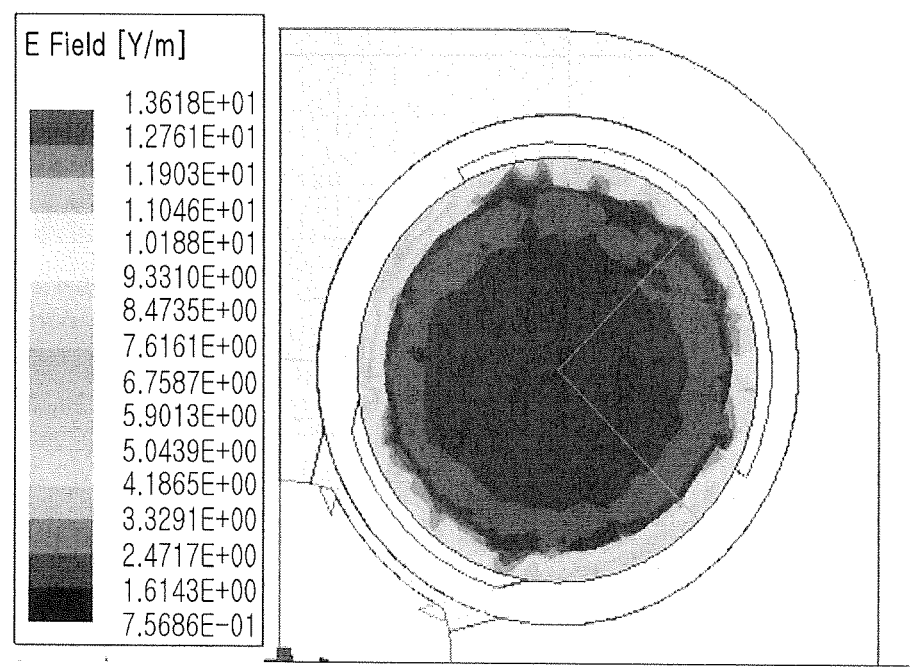

FIGS. 12A and 12B are diagrams illustrating simulation results on distribution of electric fields in the deposition apparatus according to the example embodiments.

Referring to FIGS. 12A and 12B, the intensity of electric fields at a substrate surface located on a substrate support unit according to each of a comparative example and an inventive example is shown. The simulation was performed for the case in a case in which a substrate had a diameter of 300 mm and was made of silicon. FIG. 12A shows an analysis result for the substrate placed on the substrate support unit according to the comparative example in which a coupling ring has a constant thickness. FIG. 12B shows an analysis result for the substrate placed on the substrate support unit according to the inventive example in which a coupling ring had an asymmetric cross-section as in FIG. 3. Specifically, in the case of the comparative example, the coupling ring had a thickness of 2.9 mm, and in the case of the inventive example, the coupling ring had an upward thickness of 3.8 mm in the first region.

As shown in FIG. 12A, the region on the arm part of the substrate support unit in the substrate exhibits relatively high electric field intensity. This may be because, as described above with reference to FIG. 4, the support 110 is bent to have a radius reduced inwardly at the side of the arm part 130. Hence, a shape of the support 110 is asymmetric with respect to a central axis thereof, and a thickness of the support 110 surrounding the electrode 105 therein may be uneven. Thus, electric fields transmitted to the substrate above the support 110 may exhibit differently on the arm part 130, and may be locally strong, as shown in the drawing.

However, in the substrate support unit of the inventive example, as shown in FIG. 12B, a difference in intensity of the electric fields in the region on the arm part and the peripheral region thereof in the substrate had reduced. This is because the substrate support unit of the inventive example has a structure in which the thickness of the coupling ring on the arm part is increased, thereby locally reducing the electric fields to make the distribution of the electric fields throughout the substrate uniform.

Figure 13:
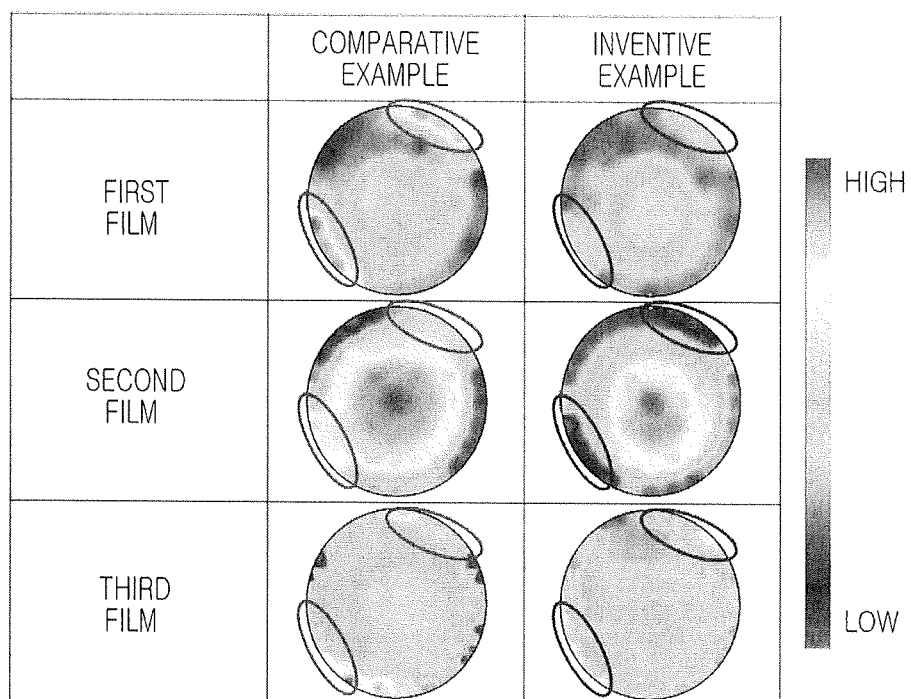
FIG. 13 is a diagram illustrating a result of thickness measurements of a thin film formed using a deposition apparatus according to example embodiments.

FIG. 13 is a diagram illustrating a result of thickness measurements of a thin film formed using a deposition apparatus according to example embodiments Referring to FIG. 13, thickness maps measured after forming different films of first to third films on a 30 mm diameter silicon substrate located on a substrate support unit according to each of a comparative example and an inventive example are shown. The substrate support unit of the comparative example has a coupling ring with a constant thickness, and the substrate support unit of the inventive example has a coupling ring with an asymmetric cross-section.

The first film is a single film of silicon nitride ($Si_3N_4$) formed on a silicon substrate, and the second film is a stacked film of silicon nitride ($Si_3N_4$) and silicon oxide ($SiO_2$) formed on a silicon substrate. The second film was formed by stacking 24 pairs of silicon nitride/silicon oxide. The third film is a stacked film formed by stacking 72 pairs of silicon nitride/silicon oxide on a silicon substrate on which a manufacturing process of a semiconductor device is partially performed. The semiconductor device may be, for example, a NAND flash device having a vertical structure, and the third film may be a stacked film of silicon nitride for substituting with a gate electrode and silicon oxide used as an interlayer insulating layer.

As shown in FIG. 13, in the case of the comparative example for the first film, it was formed locally thick in a part indicated by red ellipse. The area is an outer area of 140 mm or more from the center, and corresponds to an area where the arm part of the substrate support unit is located. As described above with reference to FIG. 12A, since the electric field is relatively strong in the region on the arm part, it may be interpreted that the deposition rate of the thin film is increased and the first film formed thickly. In the case of the inventive example for the first film, variations in the electric fields were reduced, and variations in thickness were also reduced.

In the case of the second film, it was formed relatively thick on the arm part in the comparative example, but this phenomenon did not appear in the inventive example. Although not shown in the drawing, according to the experimental results, the silicon nitride was deposited with an un-uniform thickness as compared with silicon oxide. Therefore, the second film also includes a plurality of silicon nitride films similarly to the first film, so that it may be seen that the second film has a similar tendency.

In the case of the third film, it was formed to be somewhat thick on the arm part in the comparative example, but this phenomenon did not appear in the inventive example. In the case of the third film, variations in thickness were entirely reduced as compared to the second film, but the distribution was improved in the inventive example.

Through the thickness distribution of the first to third films, it was confirmed that thickness un-uniformity in the edge region of the substrate may be improved in the inventive example. Therefore, according to the embodiments, even when the size of the substrate is increased, the thickness uniformity over the entire substrate may be secured.

By configuring the coupling ring so as to have an asymmetric cross-section with respect to the center, a substrate support unit and a deposition apparatus including the same, capable of improving process reliability, may be provided.

Various and beneficial advantages and effects of the present inventive concept are not limited to the above description, and may be more easily understood in describing concrete embodiments of the present inventive concept.

While example embodiments have been shown and described above, it will be apparent to those skilled in the art that modifications and variations could be made without departing from the scope of the present inventive concept as defined by the appended claims.

What is claimed is:

1. A substrate support unit comprising:
a support having an upper surface;
a coupling ring having an annular shape, wherein the coupling ring is disposed on an edge of the support; and
an arm part for raising and lowering the coupling ring and a substrate, wherein an edge of the substrate is disposed on the coupling ring and another portion of the substrate is disposed on the support, and wherein the arm part is disposed below and under a portion of the coupling ring,
wherein the coupling ring comprises:
a first region disposed on the arm part; and
a second region disposed in sequence with the first region in a direction along a circumference of the coupling ring, and
wherein the first region has a thickness greater than a thickness of the second region.

2. The substrate support unit of claim 1, wherein the coupling ring has a protrusion positioned in the first region.

3. The substrate support unit of claim 2, wherein an inner surface of the protrusion has an inclination to decrease a thickness thereof toward a region in which the substrate is disposed.

4. The substrate support unit of claim 2, wherein the protrusion is positioned over an entire radial width of the first region of the coupling ring outside of an area in which the substrate is disposed.

5. The substrate support unit of claim 2, wherein the protrusion is positioned over a portion of a radial width of the coupling ring outside of an area in which the substrate is disposed.

6. The substrate support unit of claim 1, wherein the coupling ring has a flat lower surface.

7. The substrate support unit of claim 1, wherein the first region and the second region include two first regions and two second regions, respectively, each of the two first regions and the two second regions being spaced apart from each other, and each of the two first regions having the thickness greater than the thickness of each of the two second regions.

8. The substrate support unit of claim 7, wherein the second regions have different sizes.

9. The substrate support unit of claim 7, wherein the first regions are disposed asymmetrically with respect to a central axis of the coupling ring.

10. The substrate support unit of claim 1, wherein the first region has a thickness 1.2 times to 1.8 times greater than a thickness of the second region outside of a region in which the substrate is disposed.

11. The substrate support unit of claim 1, wherein the coupling ring includes at least one of aluminum oxide ($Al_2O_3$), aluminum nitride (AlN), silicon carbide (SiC), and yttrium oxide ($Y_2O_3$).

12. A substrate support unit comprising:
a support comprising an upper surface;
a coupling ring having an annular shape, wherein the coupling ring is disposed on an edge of the support; and an arm part for raising and lowering the coupling ring and a substrate, wherein an edge of the substrate is disposed on the coupling ring and another portion of the substrate is disposed on the support, and wherein the arm part is disposed below and under a first portion of the coupling ring, wherein the first portion of the coupling ring that is over the arm part has a greater thickness than a second portion of the coupling ring that is not over the arm part.

13. The substrate support unit of claim 12, wherein the coupling ring has protrusions in the first portion that are asymmetrically positioned with respect to a central axis on an upper surface thereof.

14. A deposition apparatus comprising:
a chamber;
a substrate support unit positioned in the chamber; and
a gas injection unit disposed above the substrate support unit for injecting a process gas onto the substrate,
wherein the substrate support unit comprises:
a support having an upper surface;
a coupling ring having an annular shape, wherein the coupling ring is disposed on an edge of the support; and
an arm part for raising and lowering the coupling ring and a substrate, wherein an edge of the substrate is disposed on the coupling ring and another portion of the substrate is disposed on the support, and wherein the arm part is disposed below and under a portion of the coupling ring,
wherein the coupling ring comprises:
a first region disposed on the arm part; and
a second region disposed in sequence with the first region in a direction along a circumference of the coupling ring, and
wherein the first region has a thickness greater than a thickness of the second region.

15. The deposition apparatus of claim 14, wherein the chamber has a plurality of stations,
the deposition apparatus further comprising a rotation driving unit moving the substrate from one of the stations to the other station.

16. The deposition apparatus of claim 14, wherein the support includes an electrode generating an electric field for depositing a deposition target material on the substrate.

17. The deposition apparatus of claim 16, wherein the support has a circular shape bent inwardly from a side surface of the arm part.

18. The deposition apparatus of claim 14, wherein the support has a step at an edge thereof to accommodate disposition of the coupling ring.

* * * * *